(12) United States Patent
Heeringa et al.

(10) Patent No.: US 8,253,419 B2
(45) Date of Patent: Aug. 28, 2012

(54) BATTERY VOLTAGE MONITORING SYSTEM FOR MONITORING THE BATTERY VOLTAGE OF A SERIES ARRANGEMENT OF MORE THAN TWO BATTERIES

(75) Inventors: Schelte Heeringa, Drachten (NL); Wilhelmus Ettes, Drachten (NL); Oedilius Johannes Bisschop, Drachten (NL); Job Van Der Van Der Burg, Drachten (NL); Pascal Homan, Drachten (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 469 days.

(21) Appl. No.: 12/593,406

(22) PCT Filed: Mar. 31, 2008

(86) PCT No.: PCT/IB2008/051188
§ 371 (c)(1),
(2), (4) Date: Sep. 28, 2009

(87) PCT Pub. No.: WO2008/120163
PCT Pub. Date: Oct. 9, 2008

(65) Prior Publication Data
US 2010/0045299 A1  Feb. 25, 2010

(30) Foreign Application Priority Data
Apr. 3, 2007 (EP) .................... 07105532

(51) Int. Cl.
*G01N 27/416* (2006.01)

(52) U.S. Cl. ................ 324/434; 320/136
(58) Field of Classification Search ........... 324/434; 320/135, 136
See application file for complete search history.

(56) References Cited

U.S. PATENT DOCUMENTS

| | | | | |
|---|---|---|---|---|
| 3,487,295 | A * | 12/1969 | Berkowitz et al. | 324/434 |
| 4,906,055 | A | 3/1990 | Horiuchi | |
| 5,477,124 | A | 12/1995 | Tamai | |
| 5,907,238 | A | 5/1999 | Owerko et al. | |
| 6,166,549 | A | 12/2000 | Ashtiani et al. | |
| 2006/0012336 | A1 | 1/2006 | Fujita | |
| 2010/0301868 | A1* | 12/2010 | Ishikawa et al. | 324/434 |

FOREIGN PATENT DOCUMENTS

| | | |
|---|---|---|
| JP | 2000195566 A | 7/2000 |
| WO | 2005117232 A2 | 12/2005 |

* cited by examiner

*Primary Examiner* — Jay Patidar

(57) ABSTRACT

A battery voltage monitoring system monitors voltage of an arrangement of more than two batteries (U1, U2, U3, U4, U5) in series. The system comprises a voltage divider comprises a first (R1, R2, R3, R4) and second resistive element (R5, R6, R7, R8) arranged parallel to at least a part of the battery arrangement and connected to a reference voltage line and to a node (N1, N2, N3, N4) in the battery arrangement. In between the first (R1, R2, R3, R4) and second resistive element (R5, R6, R7, R8) a transistor (Q11, Q12, Q13, Q14) is arranged. The base of the transistor is, via a diode (D1, D2, D3, D4), connected to a further node (N2, N3, N4, N5) in the series arrangement of batteries, and a switching element (Q1, Q2, Q3, Q4) is provided to address the transistor (Q11, Q12, Q13, Q14).

7 Claims, 11 Drawing Sheets

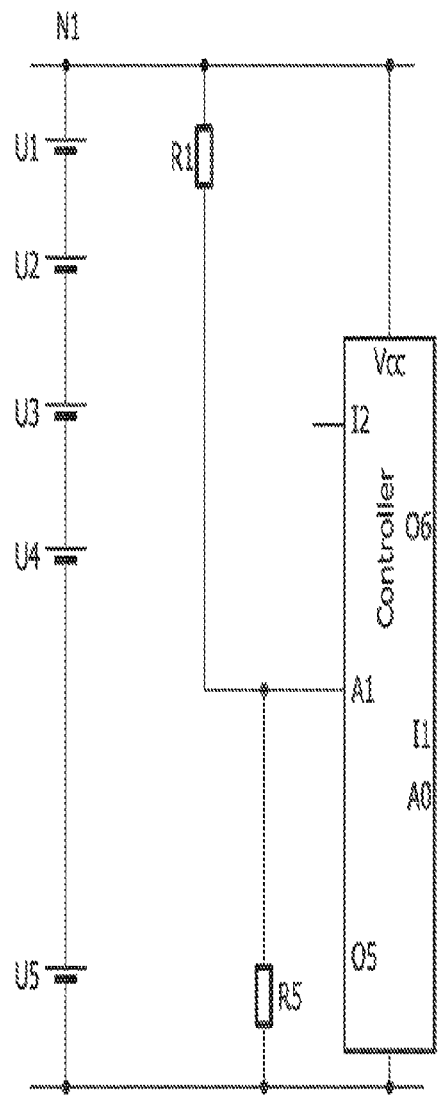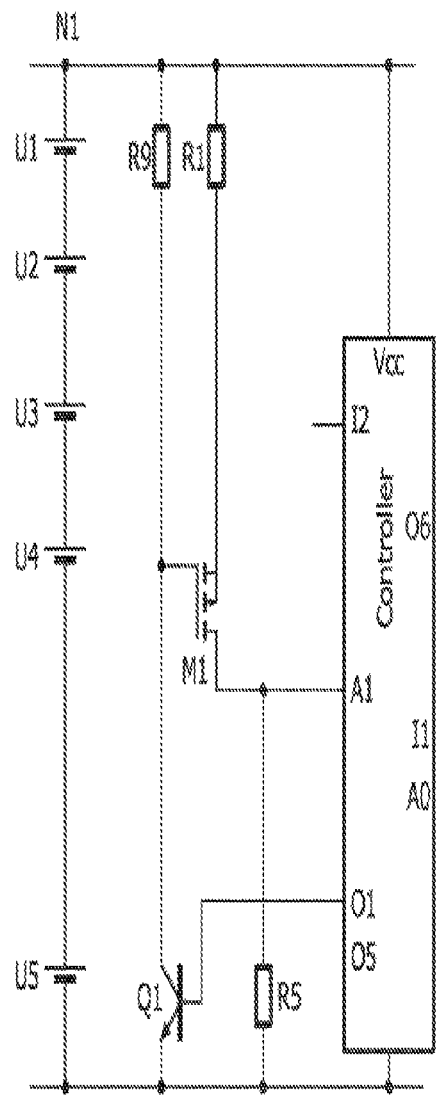
FIG. 3A
PRIOR ART
FIG. 3B
PRIOR ART

BATTERY VOLTAGE MONITORING SYSTEM FOR MONITORING THE BATTERY VOLTAGE OF A SERIES ARRANGEMENT OF MORE THAN TWO BATTERIES

FIELD OF THE INVENTION

The invention relates to a battery voltage monitoring system for monitoring battery voltage of a battery arrangement of more than two batteries in series, connected at one end to a reference voltage, wherein the monitoring system comprises a voltage divider comprising a first and second resistive element arranged parallel to at least a part of the battery arrangement and connected at one end to the reference voltage and at the other end to a node in the battery arrangement.

DESCRIPTION OF PRIOR ART

If an appliance is equipped with for instance Li-ion batteries, a more or less complex battery management system is required. Li-ion batteries and also Li-polymer have to be protected against over voltage (<4.2V) during charging. During use of the appliance the batterie(s) will be discharged. If the battery voltage of any of the batteries in the arrangement passes a certain lower limit, for instance 2.7 Volts, the appliance must be actively switched off to prevent the batteries from under charge. Otherwise this will result in permanent damage to the battery. Batteries with other chemistries (for instance NiMH) have their own other unique voltage levels. The battery arrangement is connected at one end to a reference voltage. For a single battery or the first battery in the series connected to the reference voltage the battery voltage can be measured directly. For a series arrangement of more than two batteries more complex schemes are needed. It is known to use voltage dividers arranged in parallel to at least a part of the arrangement of batteries. This allows measuring the voltage over a part of the series arrangement of batteries, i.e. the overall voltage for two, three or more batteries.

Using the known scheme, however, the errors in measurement increase as more and more batteries are used. Each measurement provides the voltage over a number of batteries. The battery voltage for a particular battery is to be calculated on the basis of the various measurements. This leads to errors. Such errors may result in unexpected damage to the battery, or, if a safety margin is applied, in switching off of the device at a real voltage of substantially higher than 2.7 Volts or terminating charging of the batteries at a voltage substantially lower than 4.2 V.

SUMMARY OF THE INVENTION

It is an object of the invention to provide an improved battery voltage monitoring system in which the accuracy of the voltage measurement is increased. This invention aims to accurately monitor the individual battery voltage of an arrangement of series connected batteries.

To this end a battery voltage monitoring system in accordance with the invention is characterized in that in between the first and second resistive element a transistor is arranged, the base of the transistor is, via a diode, connected to a further node in the series arrangement of batteries, and a switching circuit is provided to address the transistor.

When the transistor is addressed the voltage across the first resistor becomes substantially equal to the voltage between two nodes in the battery arrangement. This allows directly measuring the voltage difference over an individual battery, thus eliminating sources of error.

In a preferred embodiment, two or more voltage dividers have a common resistor. The use of a common resistor reduces measurement errors.

In a preferred embodiment, the diode is comprised in a transistor which matches the transistor in the voltage divider. This reduces errors.

In embodiments the transistor is a PNP transistor, in other embodiments an NPN transistor.

These and further aspects of the invention will be explained in greater detail by way of example and with reference to the accompanying drawings, in which

BRIEF DESCRIPTION OF THE DRAWINGS

The figures are not drawn to scale. Generally, identical components are denoted by the same reference numerals in the figures.

DETAILED DESCRIPTION OF PREFERRED EMBODIMENTS

Figure 1:
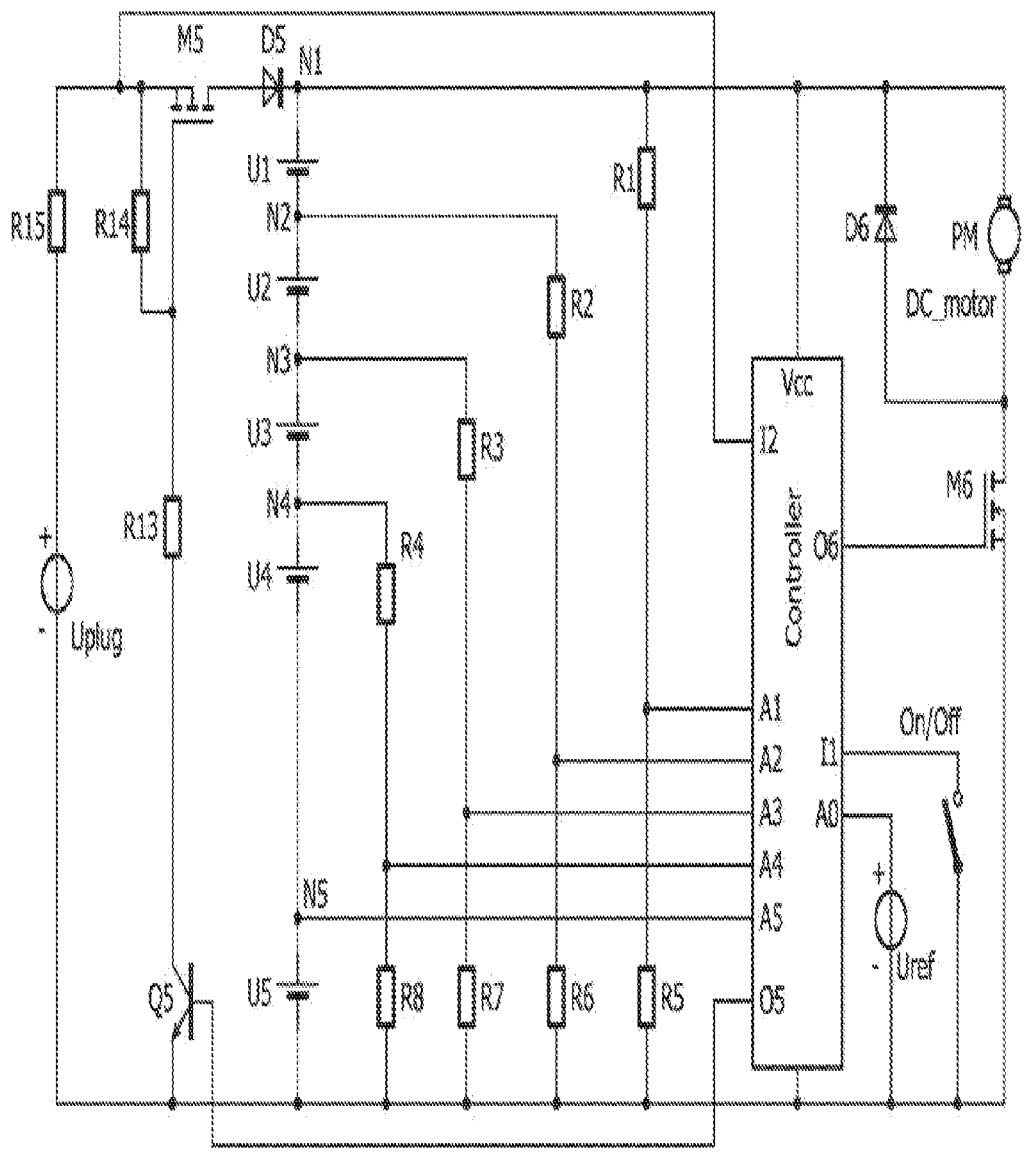
FIG. 1 illustrates a standard arrangement for measuring battery voltage in a battery system.

In FIG. 1 a general Li-ion battery management system is presented. It exists of a low voltage power plug (or "adaptor"), a series connection of Li-ion batteries (in this example five batteries), a controller, an On/Off switch and means to measure voltages. With Mosfet M5 the charging current can be interrupted. With Mosfet M6 the appliances can be switched On and Off when the On/Off switch is controlled. Charging The battery-operated appliance (Hand held vacuum cleaner, power tool etc.) will be charged if the presence is detected of the power plug voltage Uplug, by mean of the controller at input 12. If the batteries have a low charging state, the controller changes output O5 from low to high state. This switches on transistor Q5 and PMosfet M5. Resistor R15 limits the charging current. During charging the voltage of each individual battery will increase. The voltage of each individual battery (U1 to U5) must be monitored. If the battery voltage exceeds the limit of 4.2 Volt the lifetime of the battery will be reduced. To increase the number of charging/discharging cycles the maximum voltage threshold will be limited to a lower value, for instance 3.8 Volt.

Because battery U5 is referenced to a reference voltage line, in this example to ground, the cell voltage of U5 can be monitored directly by the controller with analogue input A5. The voltage of battery U1 to U4 must be monitored indirectly by means of the four voltage dividers R1/R5, R2/R6, R3/R7 and R4/R8. The four are connected to a reference voltage line (ground in this example) and to nodes N1, N2, N3, N4, respectively in the battery arrangement. The four dividers scale the voltages to the analogue inputs A1, A2, A3 and A4 in the range from 2 Volts to 3 Volts, depending on the dimensioning of each individual voltage divider. This voltage range is in the same order of magnitude of the voltage reference Uref.

To measure for instance the voltage of the voltage of battery U1, both the voltage at input A1 and A2 need to be measured and compared with voltage reference Uref. For the voltage UA1 and UA2 yields:

$$UA1 = \frac{R5}{R1+R5} \cdot U1^+ = X1 \cdot U1^+$$

$$UA2 = \frac{R6}{R2+R6} \cdot U2^+ = X2 \cdot U2^+$$

For the battery voltage U1 can now be written:

$$U1 = U1^+ - U2^+ = \frac{UA1}{X1} - \frac{UA2}{X2}.$$

This calculation is carried out by the controller. So, to measure the voltage U1 accurately, the controller has to take into account the attenuation X1 and X2. Furthermore, the tolerance on the voltage divider resistors and voltage reference must be taken into account as well to determine the required resolution of the A/D conversion process. The voltage of the batteries U2, U3 and U4 can be measured in a similar way, but each analogue input channel has to take a different attenuation factor into account.

If the controller measures a battery voltage of an individual battery higher than 3.8 Volt the charging process is stopped. The controller changes output O5 from high to low and switches Off the PMosfet M5. Diode D5 is inserted to prohibit that a battery current can flow back into the power source.

A further disadvantage of this voltage monitor system is that after charging the divider networks stay connected to the batteries. Normally high ohmic resistors are used but still a considerable amount of current will leakage away from the batteries. The more batteries are connected in series, the more voltage dividers are required, the more leakage will occur.

Discharging

The battery-operated appliance (Hand held vacuum cleaner, power tool) is switched on by pushing the On/Off switch. The controller changes output O6 from low to high state. This switches On NMosfet M6 and the DC-motor starts running. During operation of the DC-motor the batteries will be discharged. If the individual battery voltage of one of the batteries passes the minimum threshold of 2.7 Volt, the DC-motor must be switched off. This prevents the Li-ion battery from permanent damage. The controller now changes output O6 from high to low state and switches Off the NMosfet M6. The principle of monitoring the individual battery voltages during discharging is exactly the same as during charging of the batteries.

Figure 2:
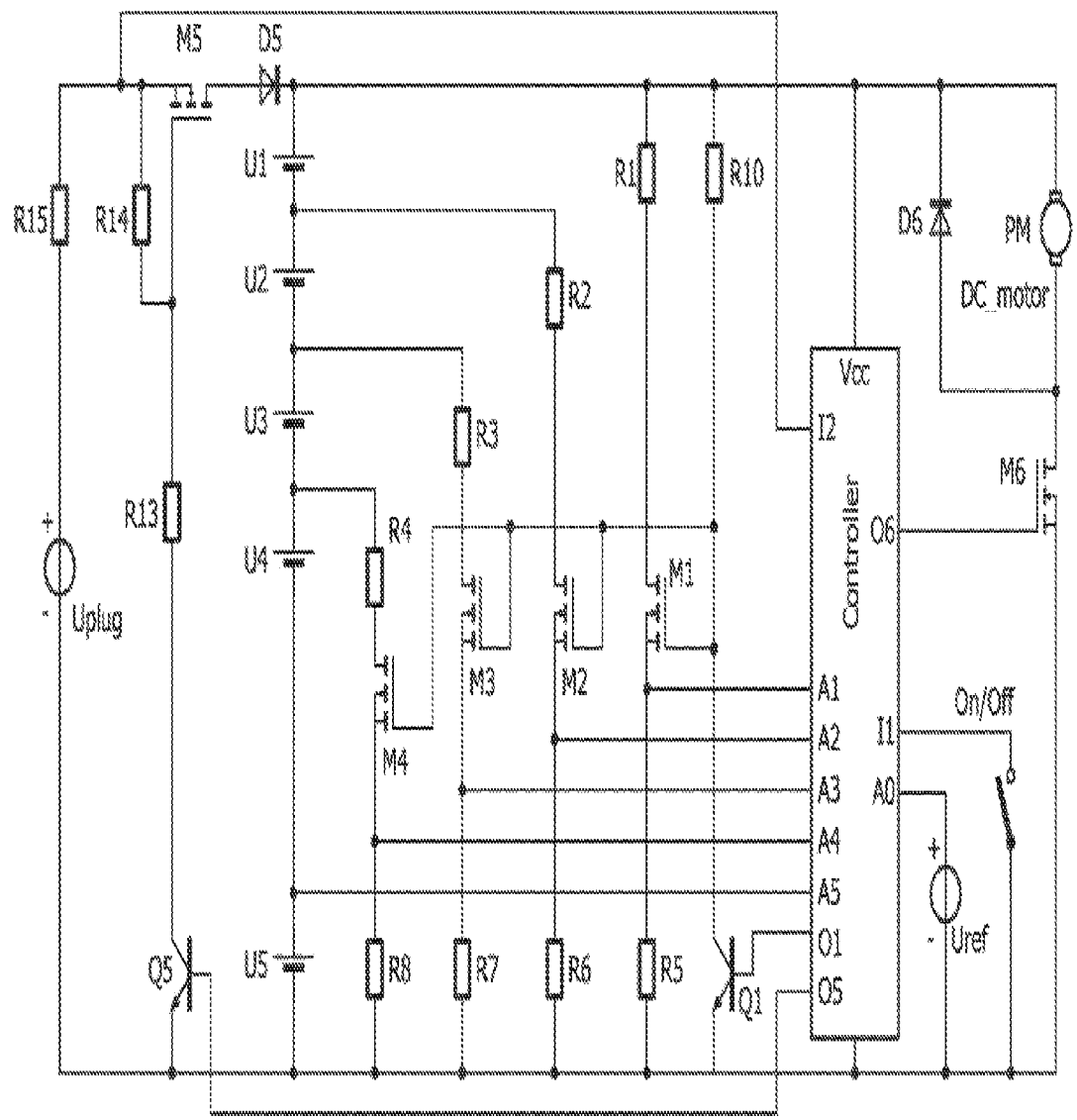
FIG. 2 illustrates a known arrangement from WO 2005/117232 using MOSFET's.

In FIG. 2 a prior art battery voltage monitoring system of a Li-ion battery arrangement is shown (Milwaukee WO2005/117232 A2). This prior art system addresses the problem of current leakage from the batteries after a full charging cycle. Each voltage divider is equipped with an NMosfet M1, M2, M3 and M4. The Rds_on of this NMosfet is chosen such that it does not influence the accuracy of the voltage monitor system, typically 0.1% of R4.

During charging the controller makes output O1 low and the voltage at the collector of Q1 will become in high state. This switches on NMosfet's M1 to M4 and the voltage dividers can be normally operated. The voltage monitoring is similar as already discussed. After a full charging cycle, the voltage dividers are disconnected from the batteries by switching off NMosfet's M1 to M4 (Output O1=high). The advantage of this system is that no longer high ohmic resistors are required in the voltage dividers. This makes the system less sensitive for noise and as a consequence, a more accurate measurement.

Although this prior art system thus increases accuracy, it does not eliminate the basic problem of the indirect battery voltage measurement, the need for the four different attenuation factors and the round off errors during the battery voltage calculation.

Figure 3C:
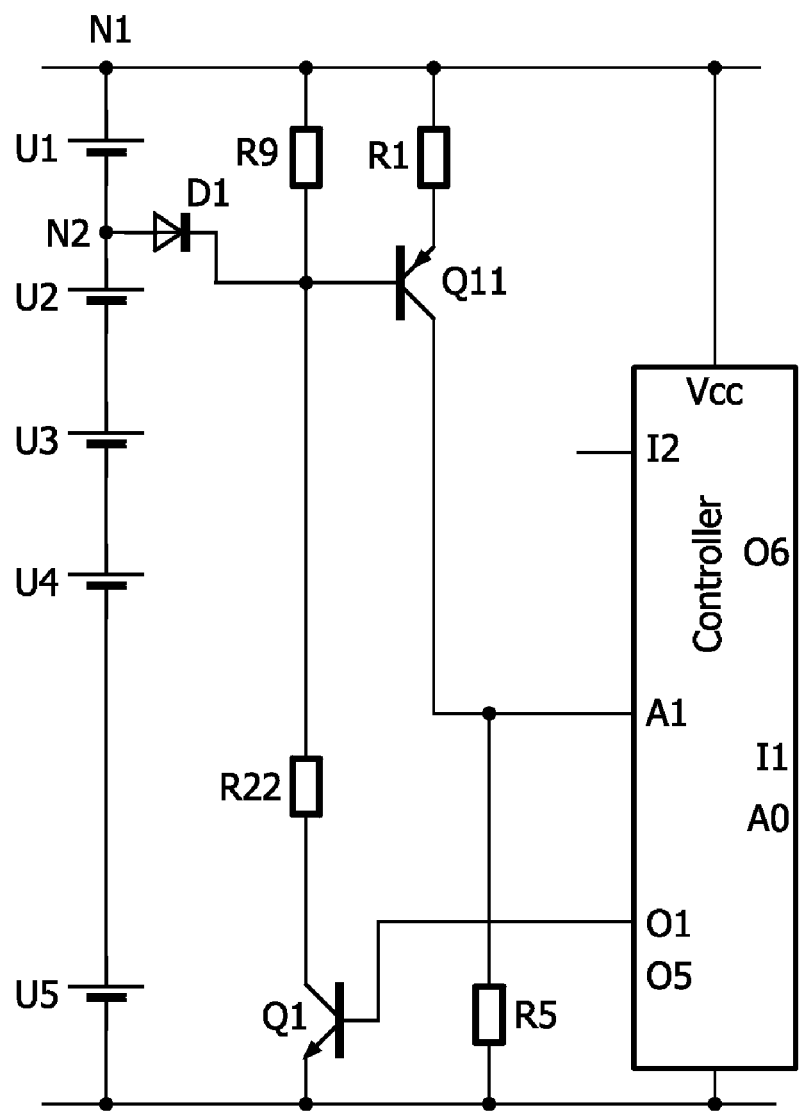
FIGS. 3A and 3B illustrate the basic components of the monitoring systems of FIGS. 1 and 2, while FIG. 3C illustrate the basic components of the monitoring system of the subject invention.

FIGS. 3A and 3B illustrate the basic components of the monitoring systems illustrated in FIGS. 1 and 2, respectively, and FIG. 3C illustrates the basic components for a monitoring system in accordance with the subject invention. For simplicity, inputs or outputs of the controller (such as A2, A3, etc.) that are not relevant for the explanation have not been drawn in FIGS. 3A-3C.

A transistor Q11 is positioned between resistor R1 and R2 in the voltage divider and its base is connected to node N2 of the battery arrangement via a diode D1. The function of diode D1 is to disconnect the base from Q11 to the node N2. If the switching element, in this example transistor Q1, is brought in the conducting state, the transistor Q11 is addressed and the voltage across resistor R1 becomes:

$U(R1)=U1+Ube(Q11)-Uak(D1)$.

If $Ube(Q11)=Uak(D1)$ this equation becomes:

$U(R1)=U1!!!$

The voltage across resistor R1 is thus proportional to the battery voltage U1 if transistor Q1 is in the conducting state. With this principle the battery voltage U1 is translated to a proportional current Ie(Q11). The current Ic(Q11) flows downwards to the ground-referenced resistor R5, making the voltage across R5 almost proportional to the battery voltage U1. This allows a direct measurement of the voltage U1, thus eliminating the need for taking into account various attenuation factors and thereby increasing the accuracy of measurement of an individual battery voltage. Also, compared to the standard arrangement as shown in part A of FIG. 3, the leakage current is reduced, and, compared to the arrangement of part B of FIG. 3, a simpler and less costly, yet more accurate arrangement is provided.

Figure 4:
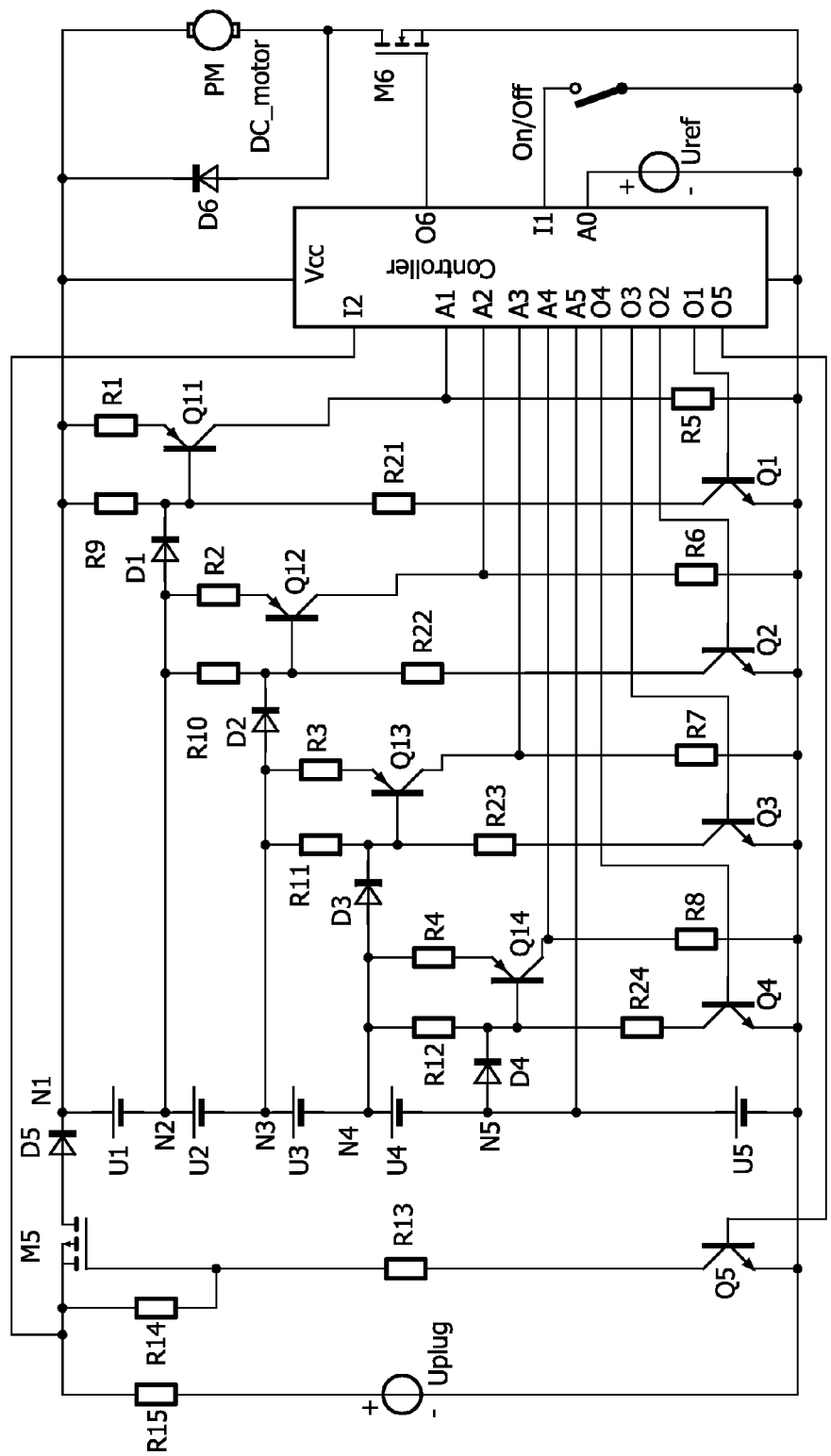
FIG. 4 illustrates an embodiment of the invention.

FIG. 4 illustrates an embodiment of a monitoring system in accordance with the invention.

Transistor Q11 to Q14 are provided between resistors R1, R2, R3 and R4 respectively resistors R5, R6, R7 and R8. The bases of the transistors Q11 to Q14 are, via diodes D1 to D4 connected to node in the battery arrangement. Switching elements for addressing the transistors are provided by means of transistors Q1 to Q4.

By addressing transistors Q1 to Q4 the battery voltage of each individual battery can be read out by the controller by means of analogue inputs A1 to A5, without the need for attenuation factors. So no rounding errors will be made and no leakage current paths are originated.

Figure 5:
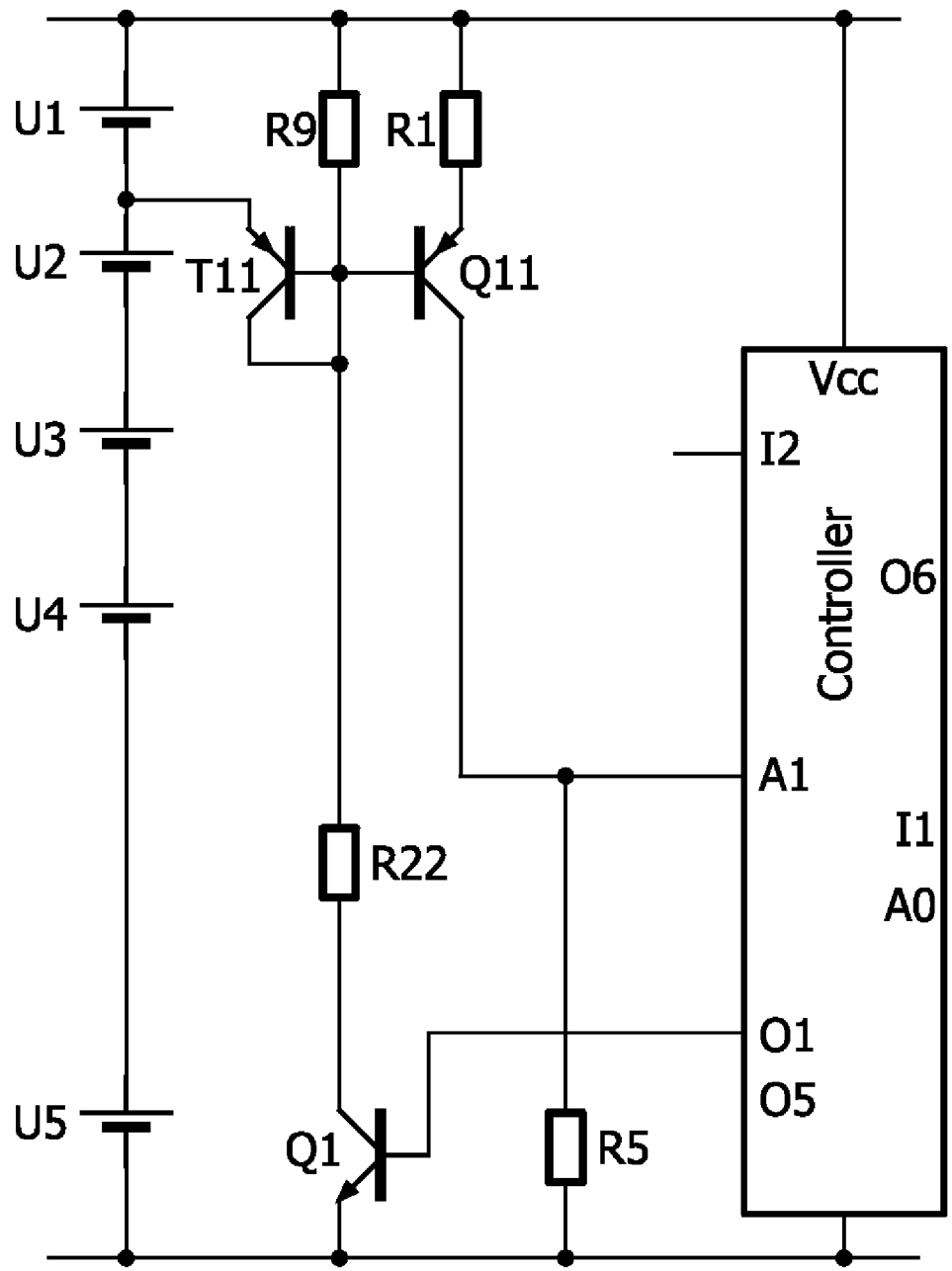
FIG. 5 illustrates a preferred embodiment of the invention.

FIG. 5 illustrates a preferred embodiment of the invention.

In the scheme of FIG. 3, part C an error remains if Ube (Q11) is not equal to Uak(D1). In FIG. 5 the diode forms part of a transistor T11 matching the PNP transistor Q11, thereby cancelling the measurement error due to the unequalness of Ube(Q11) and Uak(D1). The total accuracy is better than 2.5%, if 1% resistors are used. In this FIG. 3 the inputs and outputs of the controller that are not relevant for the explanation are not drawn.

Figure 6:
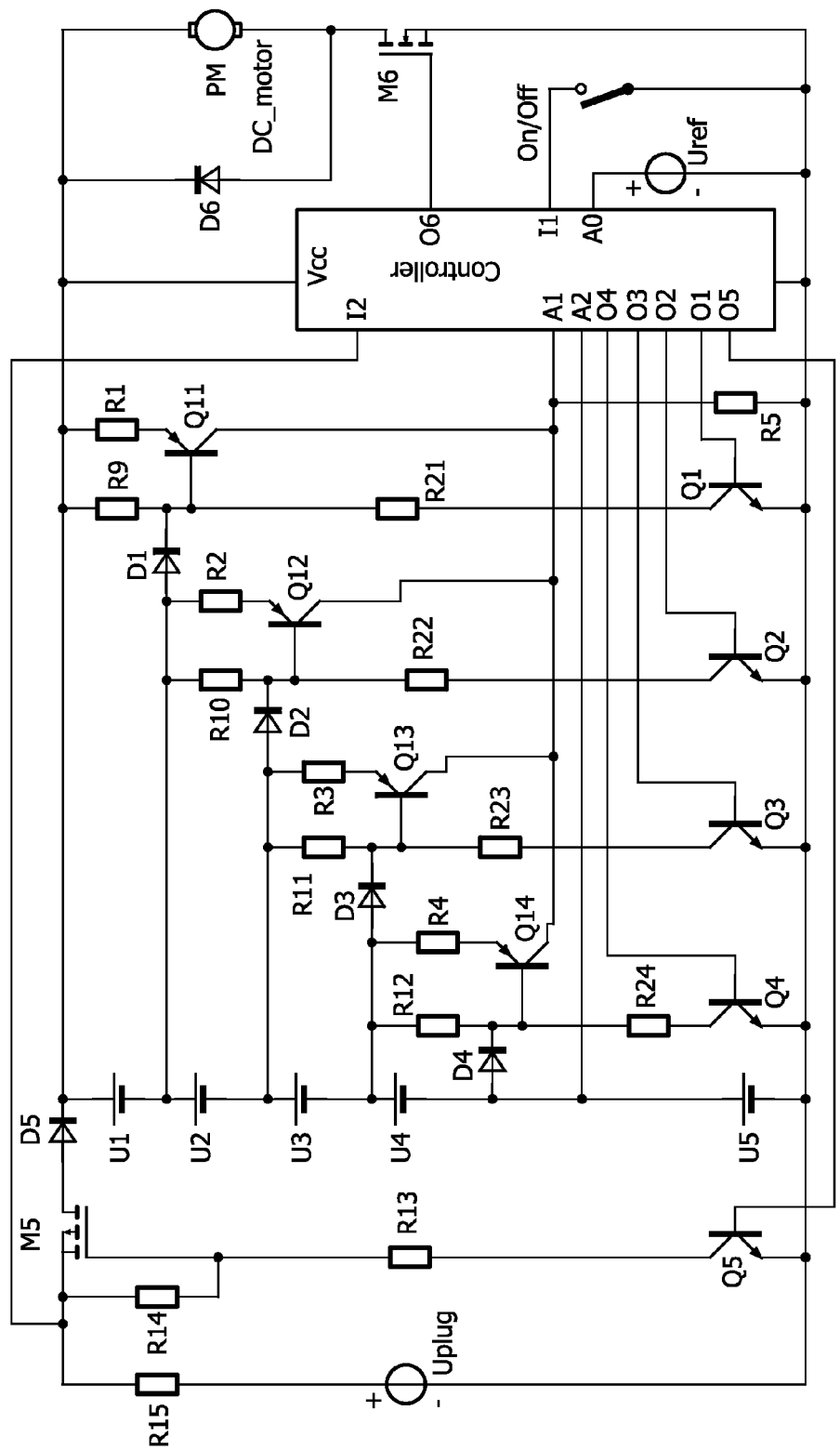
FIG. 6 illustrates a preferred embodiment of the invention.

FIG. 6 illustrates a preferred embodiment of the invention. In this embodiment various voltage dividers share a common resistor R5. Using a common resistor reduces errors and simplifies the system (less analogue input's required). Sequentially addressing of transistors Q1 to Q4 is now very useful to read out the battery voltage of each individual battery. Because the charging process is relatively slow, sequential read out of the battery voltage of each individual battery is not a problem.

Figure 7A:
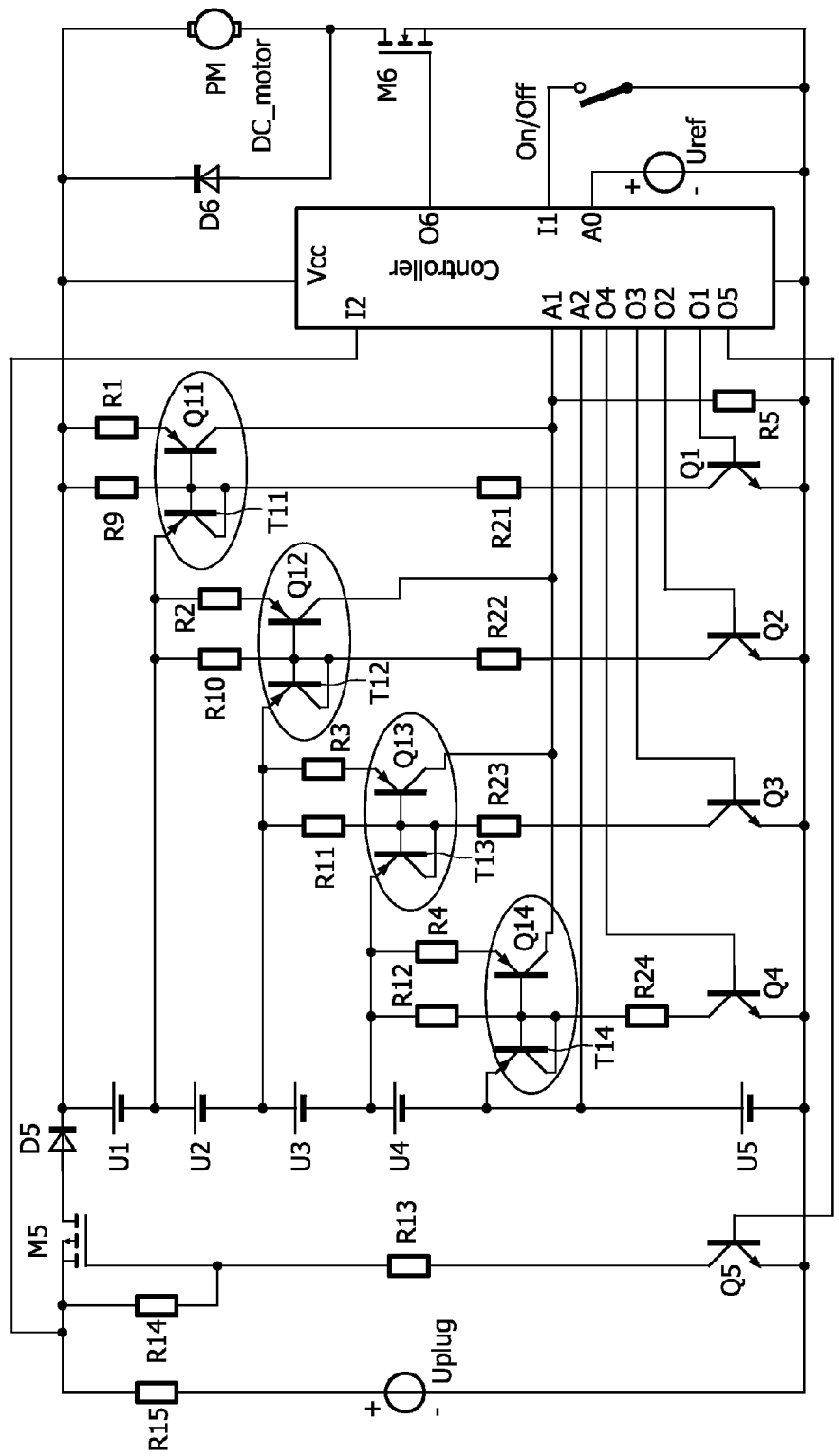
FIG. 7A illustrates a preferred embodiment of the invention.
Figure 7B:
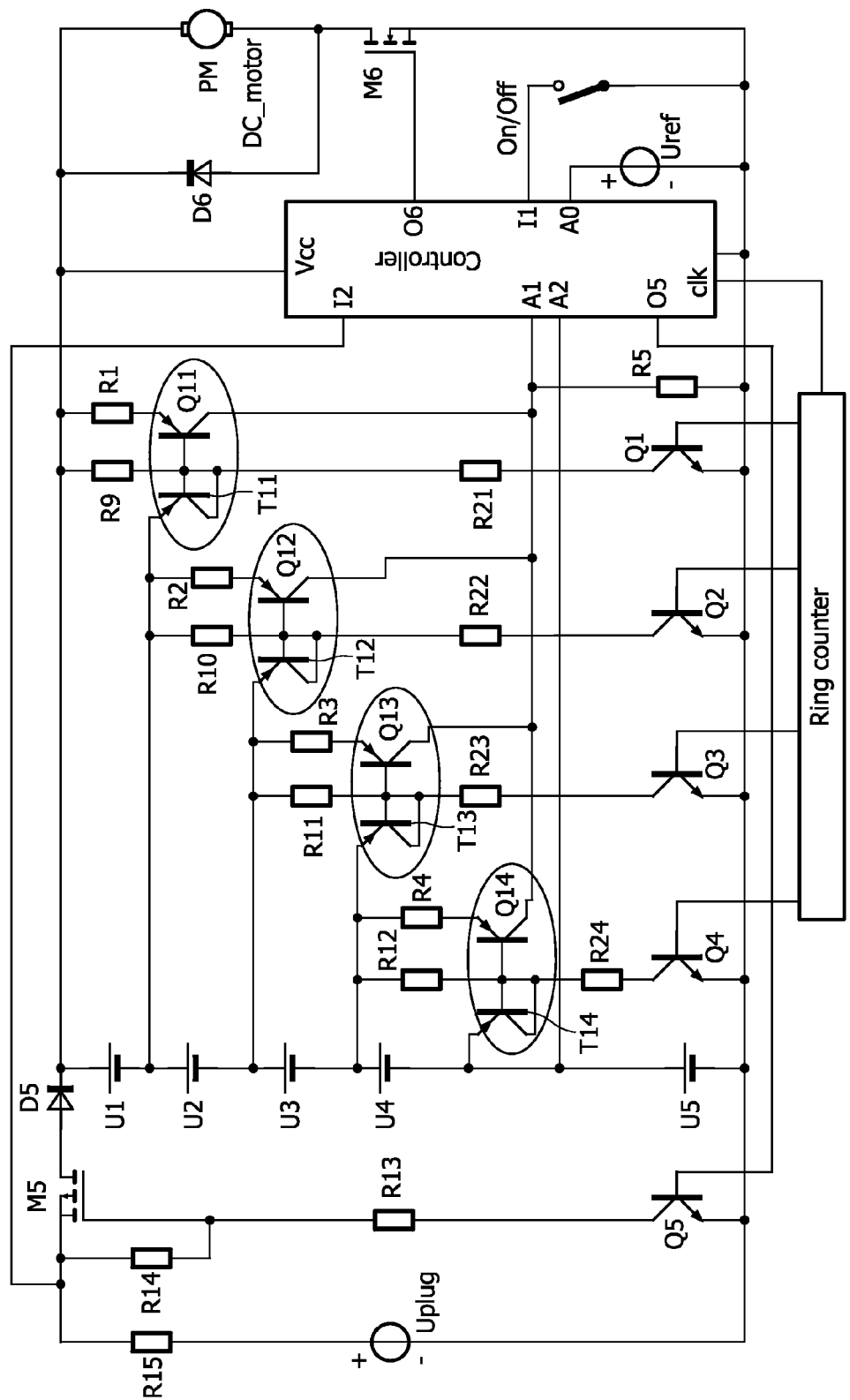
FIG. 7B illustrates a variation of the embodiment of FIG. 7A in which a ring counter is used.

FIGS. 7A and 7B illustrate embodiments in which the aspects of FIGS. 5 and 6 are combined. FIG. 7A is a straight forward combination of the two aspects. In FIG. 7B a simplified addressing system of transistors Q1 to Q4 is shown. The controller is not required to "know" which battery voltage of which individual battery passes the lower or higher voltage protection level. Therefore the addressing of transistors Q1 to Q4 can be carried out by a simple and cheap ring counter (HEF4017 alike). Especially when a large string of batteries is connected in series, this means a reduction of the number of required outputs of the controller. This enables the use of less expensive controllers.

Figure 8:
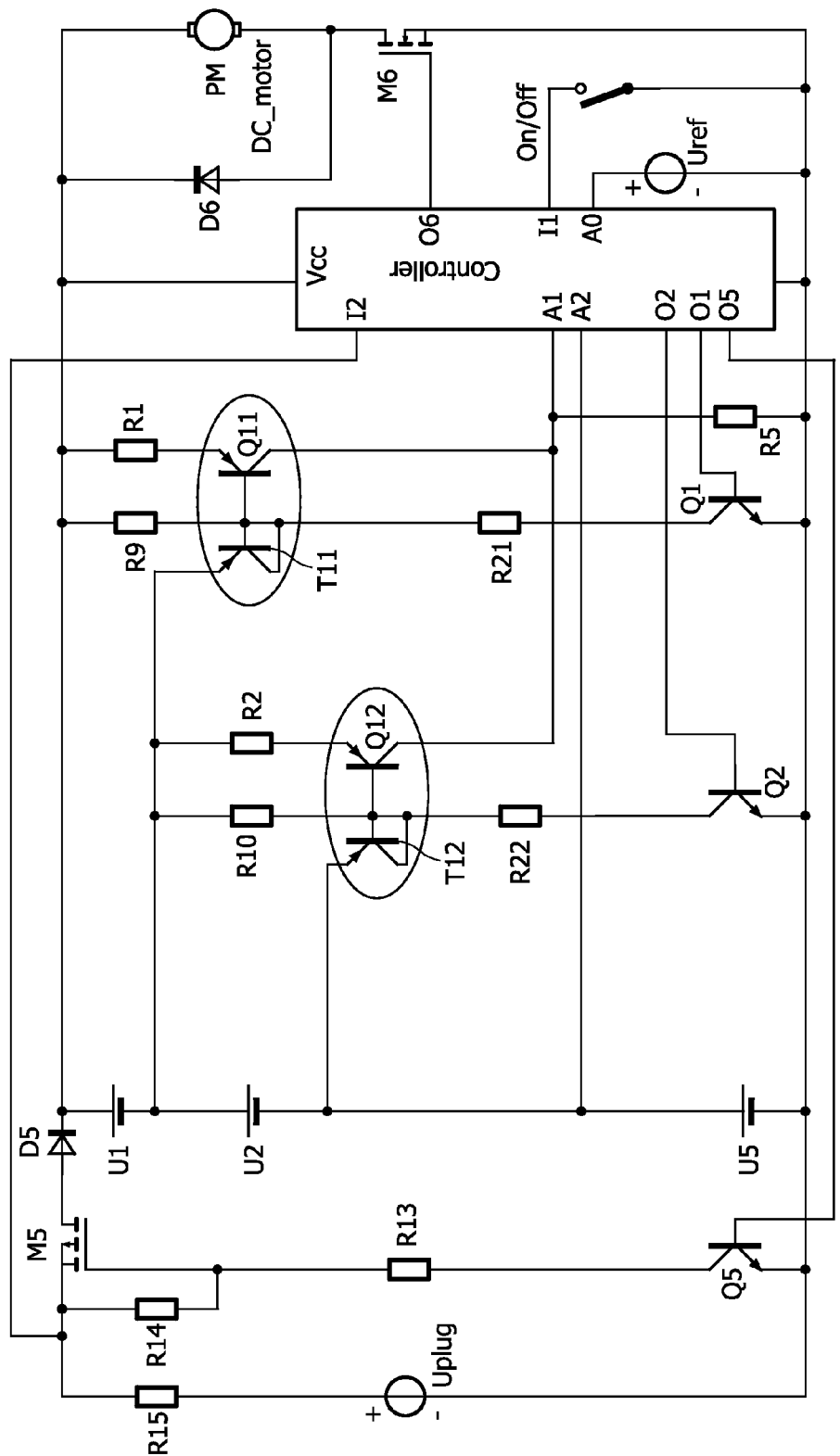
FIG. 8 illustrates a simplified version of the device shown in FIG. 7.

FIG. 8 is a simplified version of the scheme shown in FIG. 7A, in which there are only three batteries.

Figure 9:
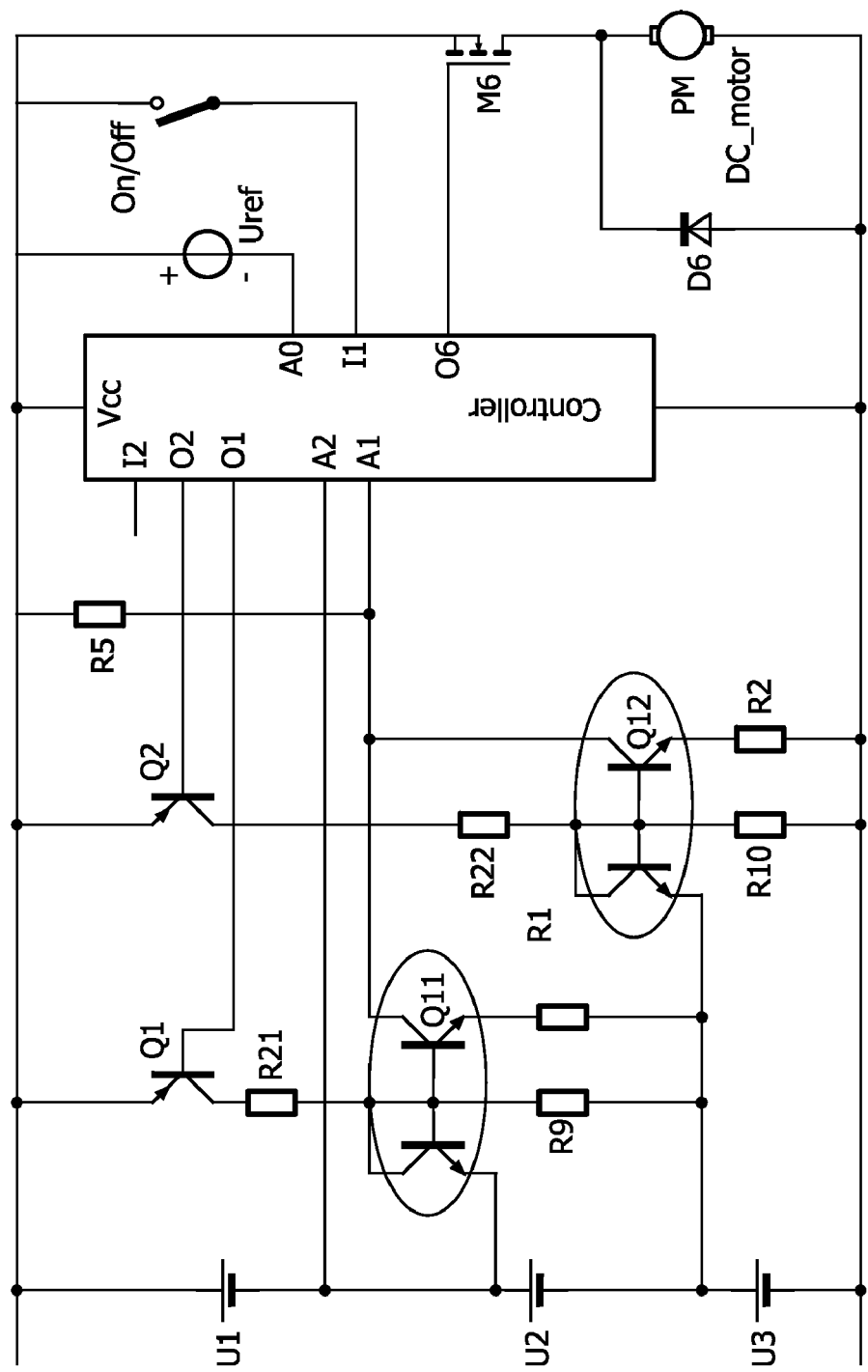
FIG. 9 illustrates an embodiment using NPN transistors.

In the previous figure PNP transistors have been used. In embodiments NPN transistors can be used. Such an arrangement is illustrated in FIG. 9. The reference voltage has become, instead of ground as in previous figures, a positive voltage line. De controller also uses the plus line as a reference. The principles of the present invention are equally applicable.

In short the invention can be described by:

A battery voltage monitoring system monitors voltage of an arrangement of more than two batteries (U1, U2, U3, U4, U5) in series. The system comprises a voltage divider comprises a first (R1, R2, R3, R4) and second resistive element (R5, R6, R7, R8) arranged parallel to at least a part of the battery arrangement and connected to a reference voltage line and to a node (N1, N2, N3, N4) in the battery arrangement. In between the first (R1, R2, R3, R4) and second resistive element (R5, R6, R7, R8) a transistor (Q11, Q12, Q13, Q14) is arranged. The base of the transistor is, via a diode (D1, D2, D3, D4), connected to a further node (N2, N3, N4, N5) in the series arrangement of batteries, and a switching element (Q1, Q2, Q3, Q4) is provided to address the transistor (Q11, Q12, Q13, Q14).

It should be noted that the above-mentioned embodiments illustrate rather than limit the invention, and that those skilled in the art will be able to design many alternative embodiments without departing from the scope of the appended claims. For instance: in the example used is made of NPN or PNP transistors, in embodiments use may be made of both of these types of transistors.

In the claims, any reference signs placed between parentheses shall not be construed as limiting the claim.

The word "comprising" does not exclude the presence of other elements or steps than those listed in a claim. The invention may be implemented by any combination of features of various different preferred embodiments as described above.

The invention claimed is:

1. A battery voltage monitoring system for monitoring battery voltage of a battery arrangement of more than two batteries in series, connected at one end to a reference voltage line, the battery voltage monitoring system comprising:
    a voltage divider comprising a first resistive element and a second resistive element arranged parallel to at least a part of the battery arrangement and connected at one end to the reference voltage line and at the other end to a respective node in the battery arrangement;
    a transistor arranged between the first resistive element and second resistive element, a base of the transistor being connected to a further node in the battery arrangement via a diode; and
    a switching element to individually switch on the transistor.

2. The battery voltage monitoring system as claimed in claim 1, wherein the diode is formed by a junction of a transistor which matches the transistor in the voltage divider.

3. The voltage monitoring system as claimed in claim 1, wherein two or more voltage dividers have a common resistor.

4. The battery voltage monitoring system as claimed in claim 1, wherein the transistor in the voltage divider is an NPN transistor.

5. The battery voltage monitoring system as claimed in claim 1, wherein the transistor in the voltage divider is a PNP transistor.

6. The battery voltage monitoring system as claimed in claim 1, wherein said battery voltage monitoring system futher comprising a ring counter.

7. A battery drivable device comprising the battery voltage monitoring system as claimed in claim 1.

* * * * *